United States Patent [19]
Michiya et al.

[11] Patent Number: 6,017,225
[45] Date of Patent: Jan. 25, 2000

[54] INTEGRAL HOLDER-CONNECTOR FOR CAPACITOR MICROPHONE

[75] Inventors: Hajime Michiya; Kouichi Yamazaki, both of Nagano-ken, Japan

[73] Assignee: Shin-Etsu Polymer Co., Ltd., Tokyo, Japan

[21] Appl. No.: 09/145,637

[22] Filed: Sep. 2, 1998

[30] Foreign Application Priority Data

Sep. 3, 1997 [JP] Japan ................................ 9-238212
Sep. 4, 1997 [JP] Japan ................................ 9-239435

[51] Int. Cl.[7] ............................................... H01R 4/58
[52] U.S. Cl. ............................... 439/91; 439/86; 179/428
[58] Field of Search .................................. 439/86, 90, 91, 439/620, 500; 379/433

[56] References Cited

U.S. PATENT DOCUMENTS

| 4,330,165 | 5/1982 | Sado . | |
| 5,374,196 | 12/1994 | Horine | 439/65 |
| 5,725,707 | 3/1998 | Koon et al. | 156/157 |
| 5,788,516 | 8/1998 | Uggmark | 439/86 |
| 5,923,750 | 7/1999 | Enting et al. | 379/428 |

*Primary Examiner*—Khiem Nguyen
*Assistant Examiner*—Michael C. Zarroli
*Attorney, Agent, or Firm*—Wenderoth, Lind & Ponack, L.L.P.

[57] ABSTRACT

An integral microphone holder-connector made from a rubbery material is disclosed, which is used in assemblage of a compact electronic instrument such as a portable telephone having a built-in capacitor microphone and which greatly improves the productivity in the mounting work of the microphone and reliability of microphone holding and positioning as well as electrical connection thereof with the mounting circuit board without necessitating soldering. The integral microphone holder-connector consists of a rubber-made microphone holder in the form of a cup for holding a microphone in the cavity thereof and a connector body forming the bottom of the cup-formed microphone holder, the connector body consisting of a rubbery connector base and a plurality of fine metal wires embedded therein in a parallel alignment running in the direction perpendicular to the bottom of the cup-formed microphone holder to extend out of the surfaces of the connector base to serve as the contacting terminals.

11 Claims, 9 Drawing Sheets

FIG. 6A  FIG. 6B  FIG. 6C
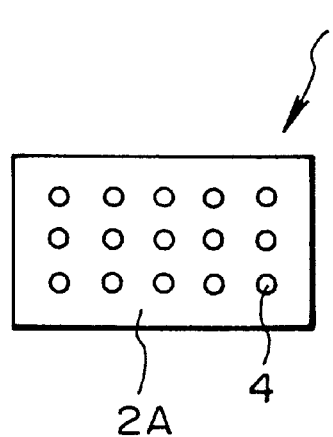
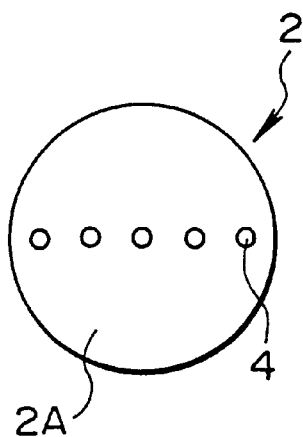
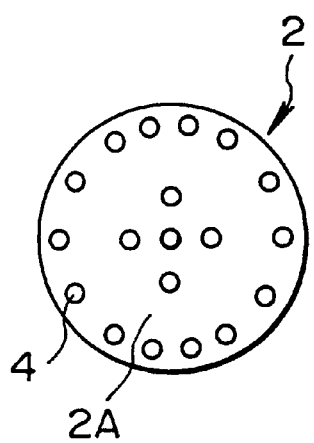
FIG. 7
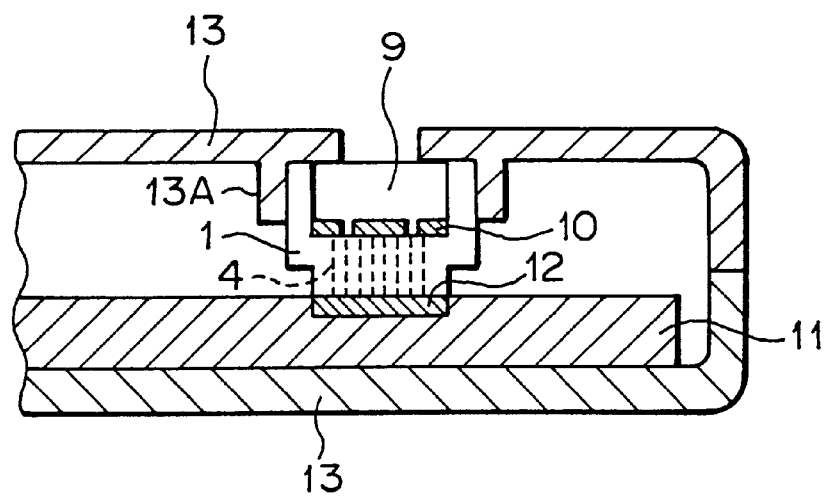

FIG. 9A
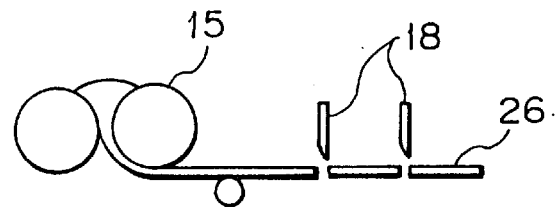
FIG. 9B
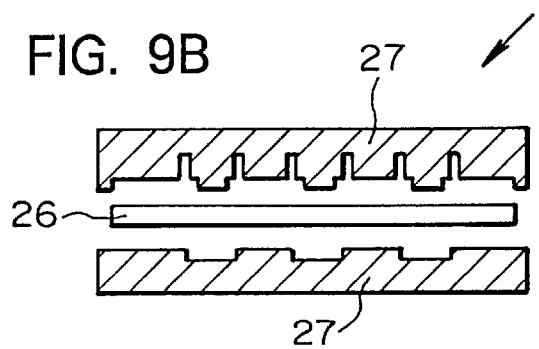
FIG. 9C
FIG. 9D
FIG. 9E
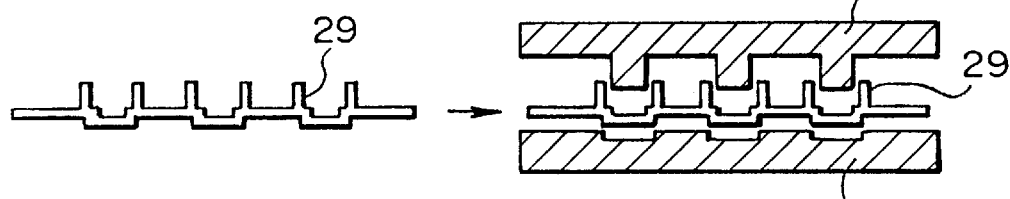
FIG. 9F
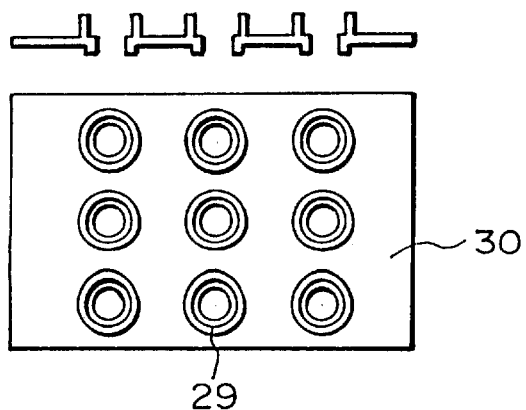

FIG. 10A
FIG. 10B
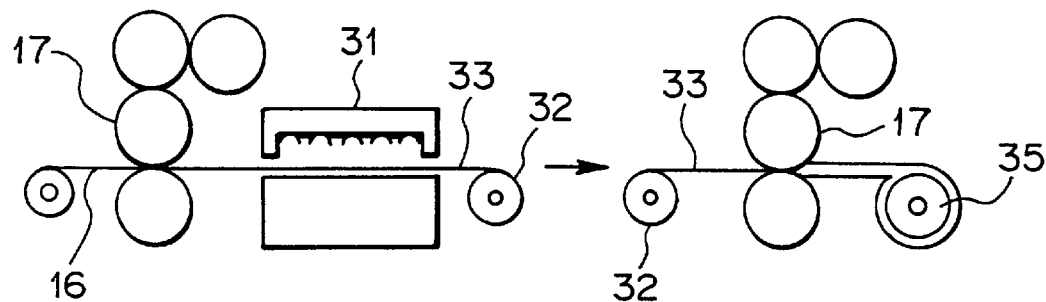
FIG. 10C
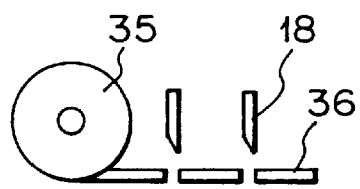
FIG. 10D
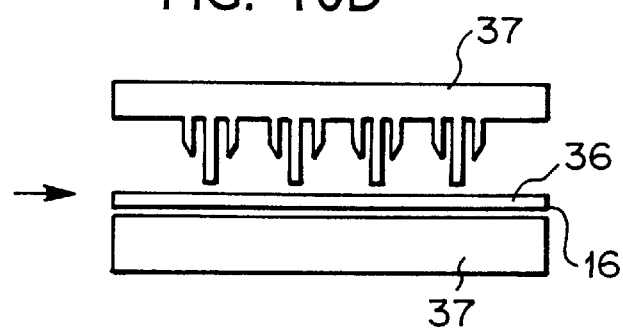
FIG. 10E
FIG. 10F
FIG. 10G
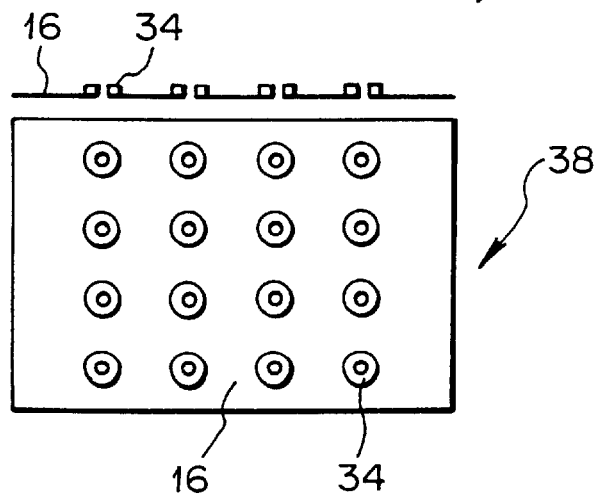

INTEGRAL HOLDER-CONNECTOR FOR CAPACITOR MICROPHONE

BACKGROUND OF THE INVENTION

The present invention relates to an integral holder-connector for a compact-size capacitor microphone, referred to simply as a microphone hereinafter, built, for example, in various kinds of mobile telecommunication instruments such as portable telephones and other wireless communication instruments, by means of which the microphone can be built into the instrument with simultaneous establishment of the electrical connection with the outer circuit, as well as to a method for the manufacture thereof and a method for accomplishment of assemblage of the instrument with the inventive microphone holder-connector.

It is the prior art that, when a microphone is to be built into a telecommunication instrument as mentioned above for assembling, as is illustrated in FIG. 1 by a cross sectional view, the lead terminals 102 of the microphone 101 and the electrodes 105 of the mounting circuit board 104 fixed to the instrument casing 103 are bonded together by soldering forming an intervening solder layer 106 therebetween to establish mechanical and electrical connection between the microphone 101 and the circuit board 104. Further, the microphone 101 is contained within and firmly held in the cavity of a microphone holder 107 mounted on the instrument casing 103.

This way of instrument assemblage for mounting of a microphone 101 is, however, not quite productive because, even by setting aside the problem of the necessity to provide the microphone 101 with lead terminals 102 suitable for soldering, the space available for the soldering work is so small that great difficulties are usually encountered in conducting the very delicate soldering work which is possible only with very high skillfulness of the workers. This problem is one of the factors laying a limit on the recent trend toward a more and more compact design of telecommunication instruments.

Accordingly, it is eagerly desired to develop a convenient and reliable means for the assemblage of a compact electronic instrument to mount a microphone thereon without necessitating any soldering works.

SUMMARY OF THE INVENTION

The present invention accordingly has a primary object to provide a means for conveniently and reliably mounting a microphone on a compact electronic instrument such as those for telecommunication without necessitating a soldering work, which object can be accomplished by means of the integral holder-connector for a microphone here proposed.

Thus, the integral holder-connector for a capacitor microphone provided by the present invention is an integral body made from an elastic rubbery material which is an integration of a microphone holder in the form of a cup with a cavity for firmly holding and positioning a capacitor microphone within the cavity thereof and a connector body integrated to the bottom of the cup-formed holder for electrically connecting the electrode terminals of the microphone held within the cavity of the microphone holder and electrode terminals on an outer circuit board.

The above defined integral holder-connector for a microphone is prepared in a process which comprises the steps of:

(a) shaping a microphone holder having a cavity for containing a microphone by molding an elastic rubber composition in a metal mold;

(b) shaping a connector body from an elastic rubber composition with fine metal wires embedded therein in a parallel alignment at a regular pitch;

(c) adhesively bonding a supporting member on each of the side walls of the connector body; at least either one of the microphone holder and the connector body being unvulcanized;

(d) integrally compression-molding the microphone holder and the connector body in a metal mold, the connector body forming the bottom of the cavity of the microphone holder; and (e) heating the integrated body of the microphone holder and the connector body to effect curing of the unvulcanized elastic rubber composition.

In place of using an unvulcanized microphone holder and/or connector body, the integral bonding thereof can be accomplished by intervention of a bonding member coated with an adhesive therebetween.

BRIEF DESCRIPTION OF THE DRAWING

FIGS. 6A, 6B and 6C are each a plan view of the connector body having a different metal wire arrangement.

FIG. 7 is an illustration of a mounting fashion of a microphone on an instrument by using the inventive integral microphone holder-connector.

FIGS. 9A to 9F are each an illustration of the manufacturing steps of the microphone holder used in the inventive integral microphone holder-connector.

FIGS. 10A to 10G are each an illustration of the manufacturing steps of the bonding member used in the assemblage of the inventive integral microphone holder-connector.

DETAILED DESCRIPTION OF THE PREFERRED EMBODIMENTS

In the following, the integral microphone holder-connector of the invention is described in detail by making reference to the figures in the accompanying drawing.

Figure 1:
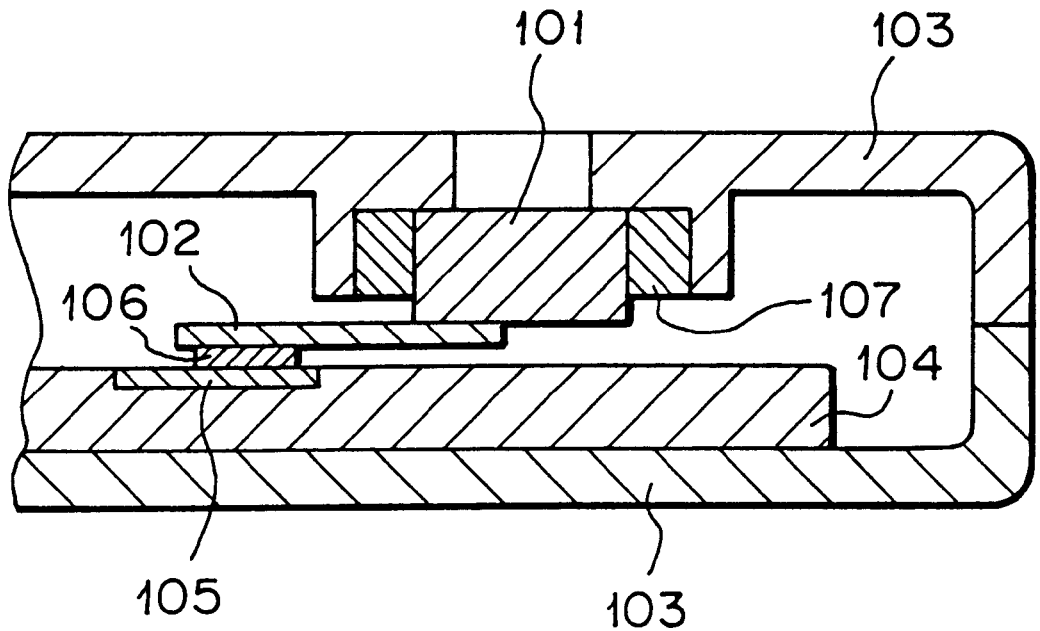
FIG. 1 is an illustration of a mounting fashion of a microphone by soldering on an instrument in the prior art by a cross sectional view.
Figures 2A, 2B, 2C:
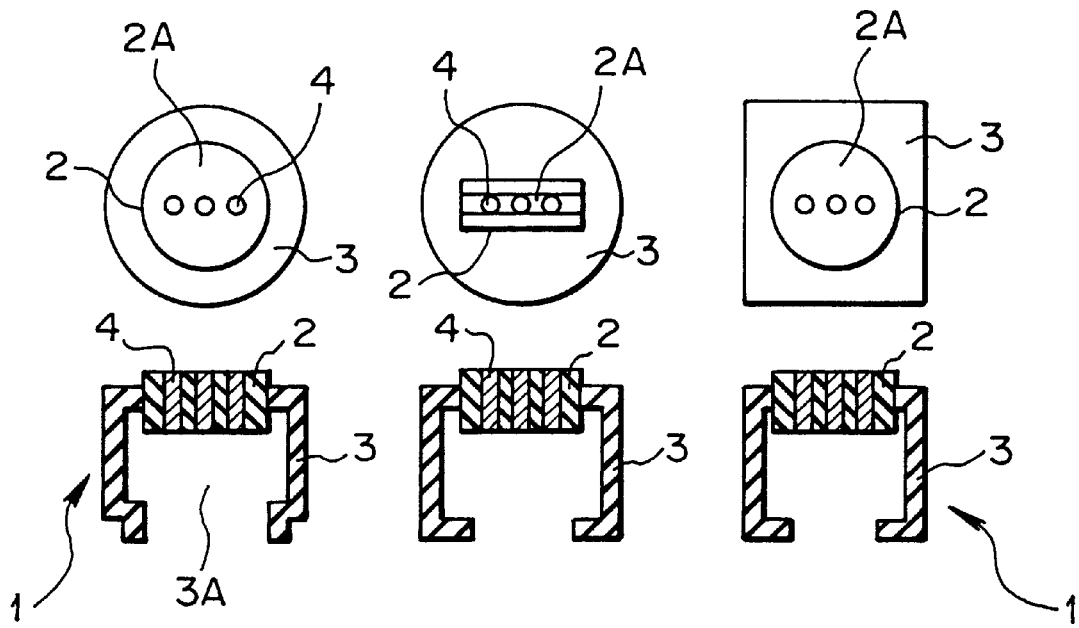
FIGS. 2A, 2B and 2C are each a schematic illustration of a variation of the inventive integral microphone holder-connectors by a plan view (upper) and a vertical cross sectional view (lower).

FIGS. 2A to 2C, FIG. 3 and FIG. 4 each illustrate a variation of the inventive integrated microphone holder-connector 1 by a plan view (upper) and by a vertical cross sectional view (lower) consisting of a microphone holder 3 and a connector body 2 integrated to the holder 3 in the form of a cup forming the bottom thereof. As is illustrated by FIGS. 2A to 2C, the connector body 2 may have different configurations defined by the connector base 2A which is circular in FIGS. 2A and 2C and rectangular in FIG. 2B, in which a plurality of fine metal wires 4 are embedded in a parallel alignment as extending from one surface to the other of the connector base 2A. The cup-formed microphone holder 3 having a cavity 3A for containing a microphone also has different configurations in the plan view which is circular in FIGS. 2A and 2B and square in FIG. 2C.

Figure 3:
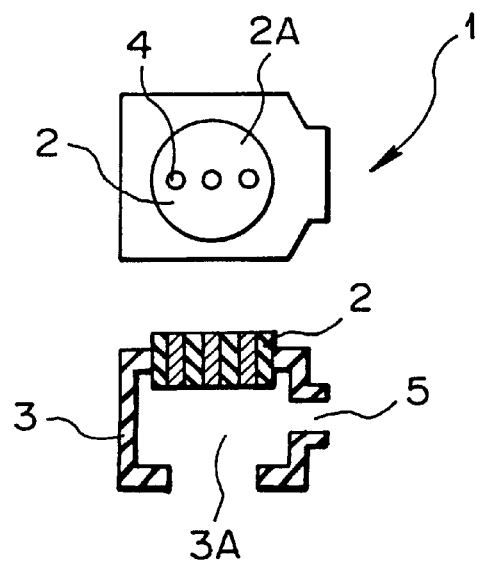
FIG. 3 is an illustration of a further variation of the inventive integral microphone holder-connectors with a side opening by a plan view (upper) and a vertical cross sectional view (lower).

In the variation of the integral microphone holder-connector illustrated in FIG. 3, the microphone holder 3 is provided on the side wall with an opening 5 which serves to improve the directivity characteristics of the microphone held within the cavity 3A so that discrimination of the objective sound from outer noises can be enhanced.

Figure 4:
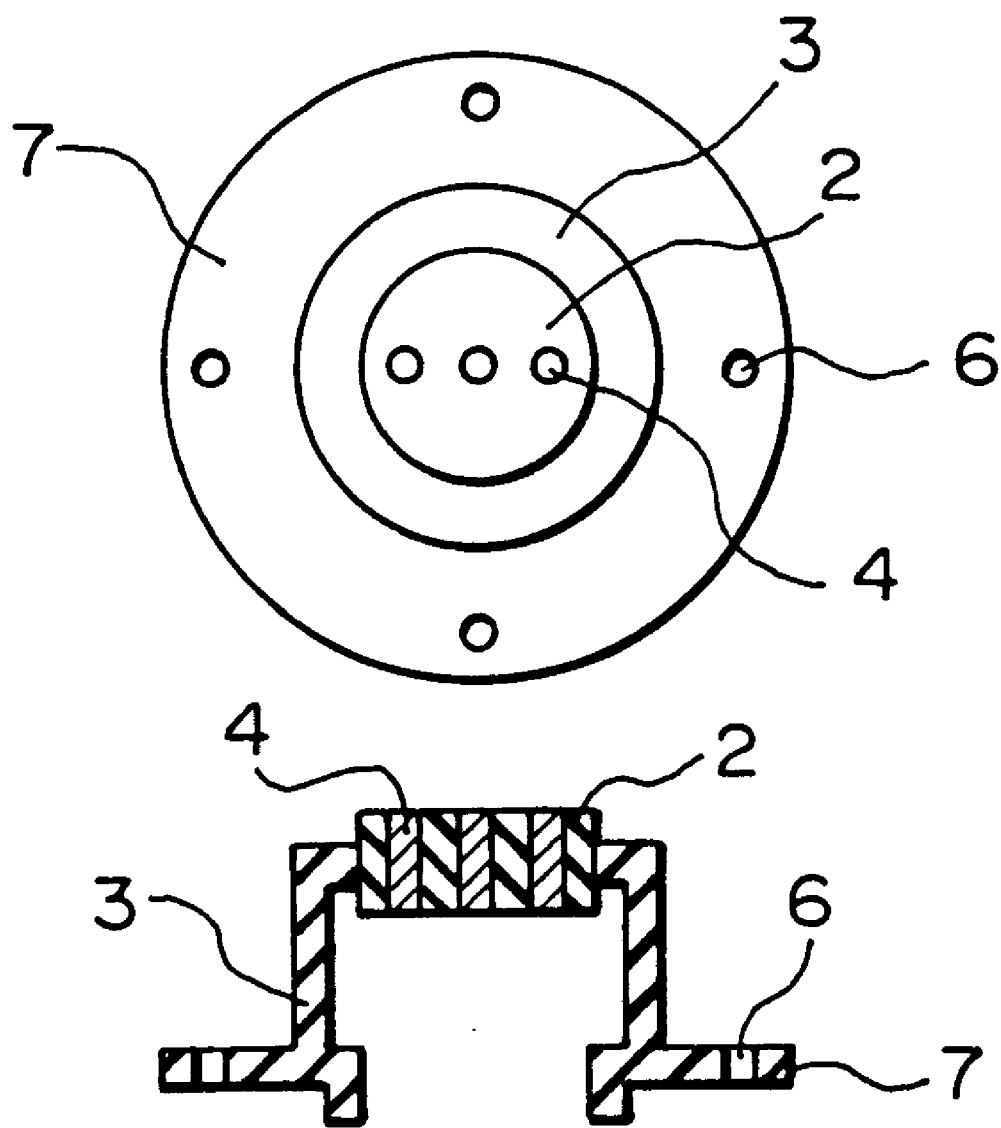
FIG. 4 is an illustration of a still different variation of the inventive integral microphone holder-connectors with a flange by a plan view (upper) and a vertical cross sectional view (lower).

In the variation of the integral microphone holder-connector illustrated in FIG. 4, the microphone holder 3 is provided around the base portion thereof with a flange 7 having several mounting holes 6. Corresponding to these mounting holes 6, the casing 13 of the instrument is provided in the inner surface thereof with several stud-like protrusions so that the mounting and positioning work of the microphone contained in the microphone holder-connector on the instrument casing 13 can be conducted very efficiently by merely bringing the mounting holes 6 on the holder flange 7 into engagement with the corresponding studs on the casing 13 without necessitating any other elaborate positioning means thereby greatly simplifying the design of the casing 13.

Figure 5A:
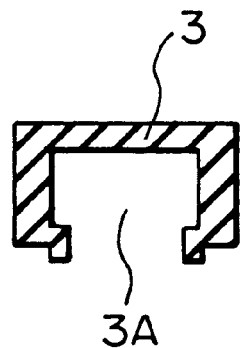
FIG. 5A is a vertical cross sectional view of a cup-formed microphone holder.
Figure 5B:
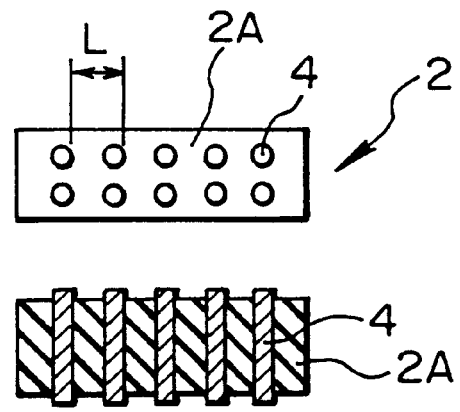
FIGS. 5B and 5C are each an illustration of a connector body to be integrated with the microphone holder by a plan view (upper) and a vertical cross sectional view (lower).
Figure 5C:
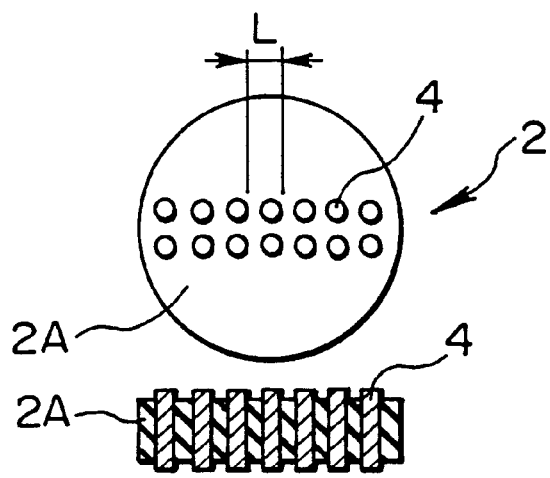

FIG. 5A illustrates a vertical cross sectional view of a microphone holder 3, which is made from an elastic rubber without integration with a connector body 2 illustrated in FIGS. 5B and 5C for those having a rectangular plan view and circular plan view, respectively. The connector bodies 2 illustrated in FIGS. 5B and 5C are each an integral body consisting of a connector base 2A made from an elastic rubber and a plurality of fine metal wires 4 embedded in the rubbery connector base 2A in a parallel alignment with a pitch L penetrating the connector base 2A from the upper surface to the lower surface.

The elastic rubbers forming the microphone holder 3 and the connector base 2A of the connector body 2, which can be the same ones or different ones each from the other, each should exhibit elastic resilience at an ambient temperature in the range from −25° C. to +90° C. with a rubber hardness in the range from 20 to 80° H. in the JIS scale and a permanent compression set not exceeding 20%. Such an elastic polymeric material can be obtained from silicone rubbers, fluorocarbon rubbers and urethane rubbers, of which silicone rubbers are preferable. Needless to say, the elastic rubbery material should contain an electrolyte in a content as low as possible.

The fine metal wires 4 are embedded in the connector base 2A of the connector body 2 running either in a direction perpendicular to the upper and lower surfaces of the connector base 2A or in a direction inclined from perpendicular by an inclination angle not exceeding about 15 degrees. It is important that each of the upper and lower end points of each metal wire 4 is protruded by 5 to 50 $\mu$m out of the surface of the connector base 2A in order to ensure reliability of the contacting condition between the metal wire 4 and the electrode terminal of the microphone or circuit board.

The metallic material forming the fine metal wires 4 is not particularly limitative but can be selected from various metals and alloys such as beryllium bronze, brass, stainless steels and nickel, of which beryllium bronze is particularly preferable in respect of the high resistance against resilience fatigue caused by the resilient contacting between the metal wires 4 and the electrode terminals. The metal wires 4 should have a diameter in the range from 5 to 100 $\mu$m. It is preferable in order to reduce the electric contact resistance and to enhance the chemical resistance against corrosion and oxidation that the surface of the metal wires 4 is provided with a plating layer of gold on an underplating layer of nickel.

FIGS 6A, 6B and 6C each illustrate a plan view of the connector body 2 having a different arrangement pattern of the fine metal wires 4 embedded in a rectangular or circular connector base 2A.

FIG. 7 is an illustration of the mounting and positioning fashion of a capacitor microphone 9 on an instrument casing 13 using the integral microphone holder-connector 1 of the invention by a schematic vertical cross sectional view so as to ensure the positional stability of the microphone 9 within the space and reliability of electrical connection between electrode terminals 10 of the microphone 9 and the electrode terminals 12 of the circuit board 11. The microphone 9 is encased in the cavity 3A of the microphone holder-connector 1 and firmly held therein by the elastic resilience of the holder body 3 so that exact positioning of the microphone 9 within the casing 13 can readily be accomplished by merely bringing the holder-connector 1 into engagement with the cavity on the inner wall of the casing 13 formed by the flange or ribs 13A. When the instrument casing 13,13 is assembled in this way, the electrode terminals 10 on the microphone 9 and the electrode terminals 12 on the mounting circuit board 11 are brought into a resiliently contacting condition through the fine metal wires 4 by virtue of the rubbery resilience of the elastic rubbery material forming the microphone holder-connector 1 under a moderate compressive force.

It is sometimes advantageous that a layer of a pressure-sensitive adhesive is provided on the surface of the connector portion of the microphone holder-connector 1 coming into contact with the microphone 9 so that the holding security of the microphone 9 in the microphone holder-connector 1 can be further improved.

As is described above, great advantages are obtained by the use of the integral microphone holder-connector of the invention in assemblage of a compact electronic instrument that the assembling work can be greatly simplified to contribute to cost reduction and further the positioning accuracy of the microphone in the instrument casing can be greatly improved to increase the yield of acceptable products.

Following is a detailed description of the process for the preparation of the-integral microphone holder-connector of the invention by way of an example making reference to the figures of the accompanying drawing. In the following descriptions, the term of "parts" always refers to "parts by weight".

In the first place, the process for the preparation of the connector body 2 used in the inventive microphone holder-connector is described by making reference to FIGS. 8A to 8G.

Figure 8A:
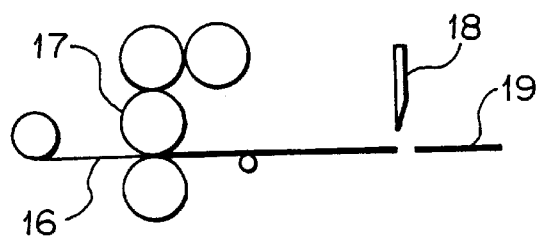
FIGS. 8A to 8G are each an illustration of the manufacturing steps of the connector body used in the inventive integral microphone holder-connector.

A curable silicone rubber composition was prepared by uniformly kneading 100 parts of a silicone rubber compound (KE 153U, a product by Shin-Etsu Chemical Co.), 0.5 part of a first vulcanizing agent (C-19A, a product by the company supra), 2.5 parts of a second vulcanizing agent (C-19B, a product by the company supra) and 1.0 part of a silane coupling agent (KBM 403, a product by the company supra) together on a mixing roller mill and the composition was applied by using a calendar roller 17 onto a continuous-length film 16 of polyethylene terephthalate (PET) having a thickness of 0.1 mm and a width of 300 mm in a coating thickness of 0.1 mm followed by cutting with a cutter blade 18 in lengths of 600 mm to prepare 300 mm by 600 mm wide rectangular cut sheets 19 (FIG. 8A).

Figure 8B:
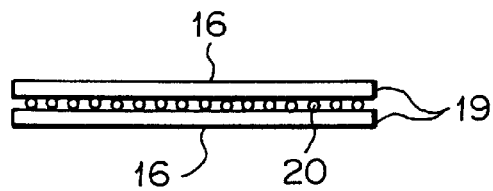
Figure 8C:
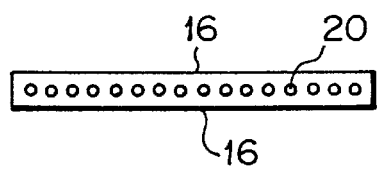

Wires 20 of beryllium bronze plated with nickel in a thickness of 0.25 $\mu$m and then with gold in a thickness of 0.15 $\mu$m each having a diameter of 20 $\mu$m were put in a parallel alignment onto the rubber-coated surface of the cut sheet 19 running in the direction parallel to the 300 mm long side line at a pitch of 0.1 mm and the array of the metal wires 20 was overlaid with another cut sheet 19 in contact with the rubber-coated surface to obtain a composite sheet having an array of metal wires 20 sandwiched with two cut sheets 19, which was cut into two 300 mm by 300 mm square composite sheets followed by vacuum deaeration for 10 minutes in a deaeration chamber and press-curing at 120° C. for 2 minutes (FIGS. 8B and 8C).

Figure 8D:
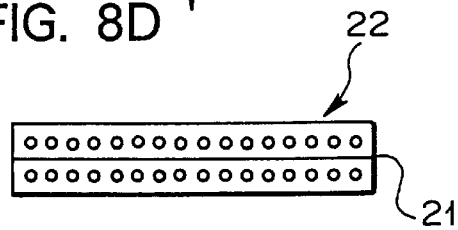

The PET films on both surfaces of the thus obtained composite sheet were removed by peeling and one of the exposed surface of the cured rubber layer was coated by screen printing with a silicone adhesive 21 curable by the addition reaction, which was a blend of equal amounts of a first and second insulating curable liquid silicone rubber compositions (KE 1800TA and KE 1800TB, each a product of the company supra) in a coating thickness of 20 $\mu$m. Two adhesive coated sheets were laid one on the other on the adhesive coated surfaces in such a fashion that the running directions of the wires 20 were identical with each other followed by vacuum deaeration for 2 minutes in a deaeration chamber and curing of the adhesive 21 by heating in a press at 120° C. for 2 minutes to give a dual composite sheet 22 (FIG. 8D).

Figure 8E:

Separately, a curable silicone rubber composition, which was a blend of equal amounts of a first and second silicone rubber compounds (KE 1940-50-A and KE 1940-50-B, each a product by the company supra), was compression-molded in a metal mold into an elongated cured rubber bar 23 to serve as a supporting member having a half-moon cross section with a rubber hardness of 50° H., radius of outer curvature of 2.15 mm, height of 2.0 mm and length of 300 mm (FIG. 8E).

Figure 8F:
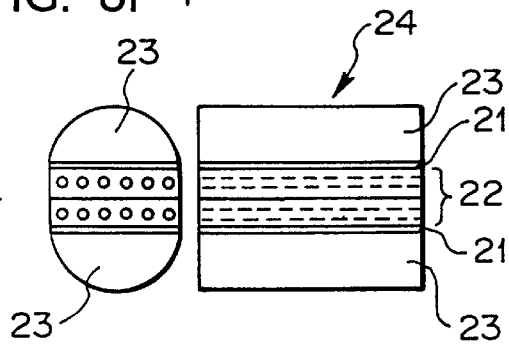

The dual composite sheet 22 was splitted in a direction parallel to the metal wires 19 to give strips of 4.25 mm width and the strip of the dual composite sheet 22 was bonded on both surfaces each to the supporting member 23 coated on the flat surface with a silicone adhesive 21 by screen printing in a coating thickness of 20 $\mu$m. The strip of the dual composite sheet 22 sandwiched by two supporting members 23 was subjected to curing of the adhesive 21 by heating at 120° C. for 2 minutes in a hot press after vacuum deaeration for 2 minutes in a deaeration chamber into an integral body 24 (FIG. 8F).

Figure 8G:
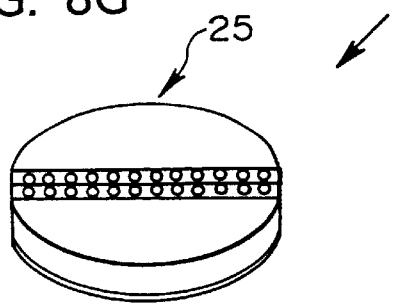

The integral body 24 was subjected to secondary curing in an oven at 215° C. for 2 hours followed by slicing in a plane perpendicular to the running direction of the metal wires 20 to give slices 25 each having a thickness of 1.1 mm. The end surfaces of the metal wires 20 exposed by slicing were subjected to dual plating first with nickel in a thickness of 0.25 $\mu$m and then with gold in a thickness of 0.1$\mu$m to complete connector bodies 25 (FIG. 8G).

Following is a description of the procedure for the preparation of a microphone holder by making reference to FIGS. 9A to 9F.

In the first place, a curable silicone rubber composition prepared in a mixing roller mill 15 by blending 100 parts of a silicone rubber compound (KE 9410U, a product by the company supra) and 2.0 parts of a curing agent (C-8, a product by the company supra) was sheeted in a thickness of 2.5 mm into a continuous-length sheet which was cut with cutting blades 18 into cut sheets 26 each having a width of 120 mm and a length of 250 mm (FIG. 9A).

The cut sheet 26 was compression-molded in a multiple metal mold by heating at 180° C. for 5 minutes into a cured rubber sheet 30 having 9 microphone holder bodies 29, in connection from which burrs were removed with a burr-removing punch 28 (FIGS. 9B to 9F).

Following is a description of the procedure for the preparation of a bonding member by making reference to FIGS. 10A to 10G.

A 300 mm wide PET film 16 having a thickness of 75 $\mu$m was coated on a calendar roller 17 with a silicone rubber composition prepared by blending 100 parts of a silicone rubber compound (SH-851U, a product by Toray Dow Corning Silicone Corp.) and 0.5 part and 2.5 parts of curing agents (C-19A and C-19B, respectively, supra) in a coating thickness of 0.1 mm and the thus coated PET film was heated in a hot air tunnel oven 31 at 150° C. to cure the rubber layer and the thus rubber-coated PET film was wound into a roll 32 (FIG. 10A).

In the next place, the rubber-coated sheet 33 was further coated thereon in a calendar roller 17 with a colored silicone rubber composition prepared by blending 75 parts of a first silicone rubber compound (KE 151KU), 25 parts of a second silicone rubber compound (KE 76VBS), 0.15 part of a first curing agent (C-1), 3.0 parts of a second curing agent (C-3M) and 1.0 part of a coloring agent (Color BB, each a product by Shin-Etsu Chemical Co.) in a coating thickness of 0.5 mm to prepare a coated sheet 36 which was wound into a roll 35 (FIG. 10B). The continuous-length coated sheet 36 was cut with cutter blades 18 into cut sheets 36 each having a width of 120 mm and a length of 250 mm (FIG. 10C).

The thus obtained coated cut sheet 36 was subjected to a punching work in a multiple punching-molding unit 37 to form a number of openings each surrounded by a ring rib for each of the bonding members as connected in an integral sheet 38 of bonding members 34 (FIGS. 10D to 10G).

Following is a description of the procedure for the preparation of the microphone holder-connector by integrating the connector body and microphone holder by using the bonding member by making reference to FIGS. 11A to 11D.

Figure 11A:
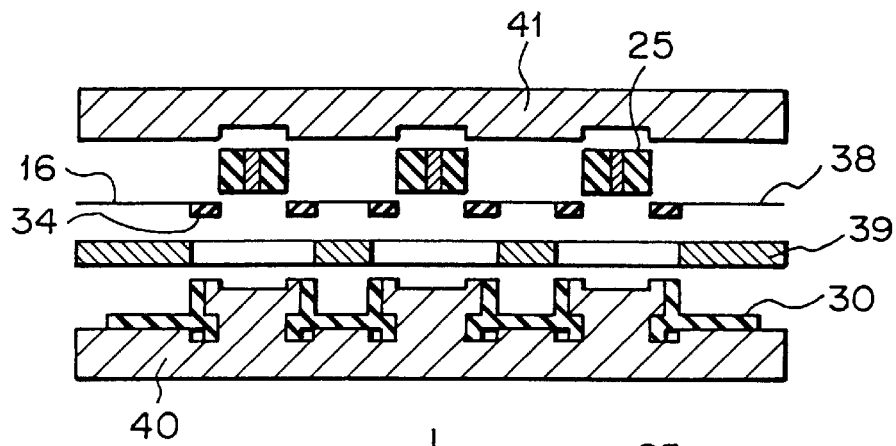
FIGS. 11A to 11D are each an illustration of the steps for integration of the microphone holder and the connector body by using the bonding member to make up an integral microphone holder-connector of the invention.
Figure 11B:
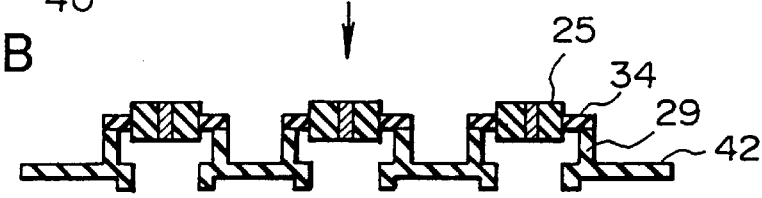

The integral sheet 30 of microphone holders was placed in the lower mold 40 of a metal mold for integration and covered with a positioning insert board 39. Further thereon, the multiple sheet 38 of the bonding members 34 was put with the ring ribs of the bonding members 34 facing downwardly. Then the connector bodies 25 were mounted to fit the center opening surrounded by the ring rib in the bonding member 34. Then, the upper mold 41 of the metal mold was mounted thereon and the metal mold was closed to effect compression molding in a hot press at 150° C. for 5 minutes to give an integrally molded sheet 42 in which the microphone holders 29 and the connector bodies 25 were integrated with intervention of the bonding members 34 foamed to have a porous structure (FIGS. 11A and 11B).

Figure 11C:
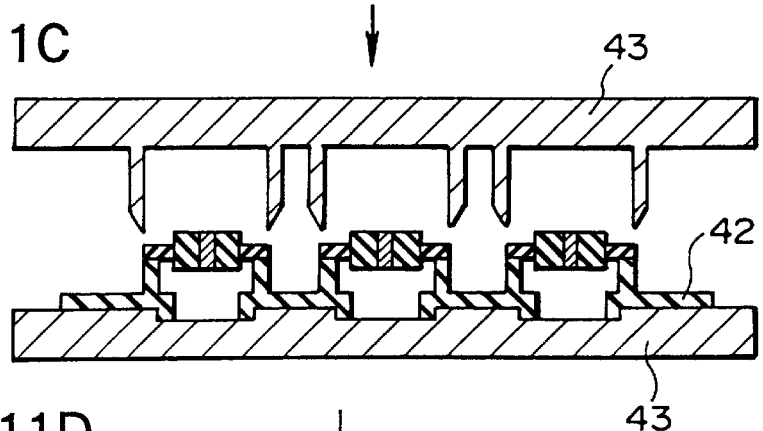
Figure 11D:
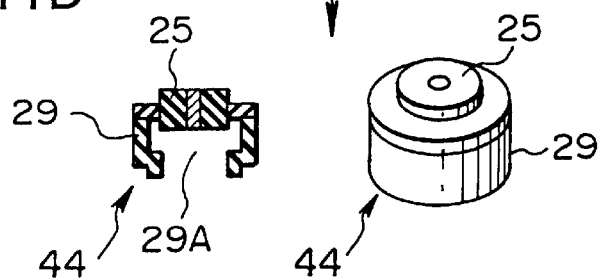

In the next place, the integrally molded sheet 42 was subjected to secondary curing by heating in a hot air oven at 215° C. for 2 hours and then disintegrated into individual microphone holder-connectors 44 by using a burr-removing punch and die 43 (FIGS. 11C and 11D). FIG. 11D illustrates the completed microphone holder-connector 44 consisting of the microphone holder 29 defining the microphone-holding cavity 29A and the connector body 25 by an axial cross sectional view (left) and by a perspective view (right).

It is not always indispensable to use the bonding member 34 for integration of the microphone holder 29 and the connector body 25. Alternatively, the microphone holder 29 and the connector body 25 can be integrated, when either one or both of these members are still in an unvulcanized state, by subjecting them to integration by compression together.

The above described integral microphone holder-connector 44 can be used in the assemblage of an instrument by mounting a capacitor microphone using the integral microphone holder-connector 44, as is illustrated in FIG. 7, by holding the microphone 9 with elastic resilience in the cavity 29A of the microphone holder 29 and by bringing the electrode terminals of the microphone or lead terminals coming therefrom and the electrode terminals of the mounting circuit board into a press-contacting condition with intervention of the connector body 25 therebetween.

What is claimed is:

1. A microphone holder-connector for mounting a capacitor microphone on an instrument, said holder-connector comprising:

a microphone holder formed of rubbery material having a rubber hardness in the range of from 20 to 80° H. on the JIS scale and a permanent compression set not exceeding 20%, said microphone holder having a cup shape defining a cavity for holding and positioning the capacitor microphone; and a connector body, integral with said microphone holder and forming a bottom of said cup shape thereof, for electrically connecting electrode terminals of the capacitor microphone with electrode terminals of an outer circuit board when the capacitor microphone is held within said cavity, said connector body including a connector base having metal wires embedded therein, said metal wires being formed of beryllium bronze, each said metal wire having a diameter in the range of from 5 to 100 μm, and each said metal wire having opposite ends protruding from respective opposite surfaces of said connector body by a length of 5 to 50 μm.

2. A holder-connector as claimed in claim 1, wherein said metal wires extend in a parallel alignment and approximately perpendicular to said bottom of said cup shape of said microphone holder.

3. A holder-connector as claimed in claim 1, wherein said rubbery material of said microphone holder is silicone rubber.

4. A holder-connector as claimed in claim 1, wherein said connector body and said microphone holder are integrally joined by a bonding member interposed between said connector body and said microphone holder.

5. A method of forming a microphone holder-connector, said method comprising:

forming, from a rubbery material having a rubber hardness in the range of from 20 to 80° H. on the JIS scale and a permanent compression set not exceeding 20%, a microphone holder having a cup shape defining a cavity;

forming a connector body including a connector base of a rubber composition and metal wires embedded therein, said metal wires being formed of beryllium bronze, each said metal wire having a diameter in the range of from 5 to 100 μm, and each said metal wire having opposite ends protruding from respective opposite surfaces of said connector body by a length of 5 to 50 μm; and integrally bonding said connector body to said microphone holder such that said connector body forms a bottom of said cup shape of said microphone holder and such that said metal wires extend approximately perpendicular to said bottom.

6. A method as claimed in claim 5, wherein said rubbery material comprises silicone rubber.

7. A method as claimed in claim 5, wherein said integrally bonding comprises interposing a bonding member between said connector body and said microphone holder.

8. A method of mounting a capacitor microphone in an instrument casing holding a circuit board while achieving electrical connection between electrode terminals of said capacitor microphone and electrode terminals of said circuit board, said method comprising:

interposing between said capacitor microphone and said circuit board a microphone holder-connector including:

a microphone holder formed of rubbery material having a rubber hardness in the range of from 20 to 80° H. on the JIS scale and a permanent compression set not exceeding 20%, said microphone holder having a cup shape defining a cavity for holding and positioning the capacitor microphone; and a connector body, integral with said microphone holder and forming a bottom of said cup shape thereof, for electrically connecting said electrode terminals of said capacitor microphone with said electrode terminals of said circuit board when said capacitor microphone is held within said cavity, said connector body including a connector base having metal wires embedded therein, said metal wires being formed of beryllium bronze, each said metal wire having a diameter in the range of from 5 to 100 μm, and each said metal wire having opposite ends protruding from respective opposite surfaces of said connector body by a length of 5 to 50 μm;

while contacting the protruded said opposite ends of said metal wires with respective said electrode terminals of said capacitor microphone and said electrode terminals of said circuit board; and applying a contacting pressure between said capacitor microphone and said circuit board with said connector body interposed therebetween.

9. A method as claimed in claim 8, wherein said applying said pressure is achieved by resiliency of said rubbery material of said microphone holder.

10. A method as claimed in claim 8, wherein said rubbery material comprises silicone rubber.

11. A method as claimed in claim 8, wherein said connector body and said microphone holder are integrally joined by a bonding member interposed between said connector body and said microphone holder.

* * * * *